THERMOELECTRIC ELEMENTS COMPRISING BISMUTH-BISMUTH BROMIDE OR BISMUTH-BISMUTH CHLORIDE

Filed Sept. 6, 1966

INVENTOR.
JORDAN D. KELLNER
BY Henry Kolin
ATTORNEY 3,554,807

THERMOELECTRIC ELEMENTS COMPRISING BISMUTH-BISMUTH BROMIDE OR BISMUTH-BISMUTH CHLORIDE

Jordan D. Kellner, Simi, Calif., assignor, by mesne assignments, to the United States of America as represented by the United States Atomic Energy Commission Filed Sept. 6, 1966, Ser. No. 577,449
Int. Cl. H01m
U.S. Cl. 136—83 11 Claims

ABSTRACT OF THE DISCLOSURE

A thermoelectric element and process for the direct conversion of heat to electricity wherein a temperature gradient established in a molten bismuth-bismuth bromide or bismuth-bismuth chloride composition serves to establish a concentration gradient in the composition and a resultant potential difference. The concentration gradient is continuously maintained in the composition by preventing convective heat flow within the composition and by passage of the more volatile bismuth bromide or bismuth chloride component in the vapor phase from one portion of the molten composition at one temperature to another portion at a lower temperature.

The present invention relates to thermoelectric elements, devices, and processes which are of utility for the direct conversion of heat to electricity. More particularly, this invention relates to improved thermoelectric elements and devices which uniquely provide thermoelectric power by utilization of a Soret effect. The invention described herein was made in the course of, or under, a contract with the U.S. Atomic Energy Commission.

Heretofore, thermoelectric power has been principally generated by utilization of the Seebeck effect, i.e., if a closed circuit be made of two conductors of dissimilar material and one junction is maintained at a different temperature than the other, an electric current will flow in the circuit. Certain semiconductors have been found to possess large Seebeck coefficiencies (thermoelectric power in terms of potential difference per ° C.). For the best of such materials available, Seebeck coefficients as high as 200 to 300 microvolts/° C. have been obtained.

The quality of a thermoelectric material may be quantitatively approximated by utilizing a figure of merit Z, which is well established as indicating the usefulness of materials in practical applications. This figure of merit is usually defined as $$Z=S^2\sigma/K$$

where S is the thermoelectric power or Seebeck coefficent, $\sigma$ is the electrical conductivity and K is the thermal conductivity.

The thermoelectric power S may be defined as the electromotive force per degree induced by a temperature difference between two ends of a thermoelectric material. A high value of S is important for effective conversion of heat to electricity. The requirement for low thermal conductivity, K, is also important since it would otherwise be difficult to maintain either high or low temperatures at a junction of a thermoelectric element if the material conducted heat too readily. Further, the requirement that a good thermoelectric material have high electrical conductivity, $\sigma$, is important since this factor limits the maximum amount of current passing through the circuit. Because presently known thermoelectric materials have limited values of both thermoelectric power and the resultant figure of merit, the need exists for thermoelectric materials having higher such values if thermoelectric power generation is to be more widely utilized.

It has now been found that thermoelectric elements showing high values for the thermoelectric power and figure of merit may be made utilizing the Soret effect for the conversion of heat to electricity. While thermoelectric power is generally due to a Seebeck effect, in the present invention significant thermoelectric power S, expressed in the same units (microvolts/° C.), is obtained by the establishment of a steady-state Soret potential. The Soret effect is well known and represents the tendency for the establishment of a concentration gradient in a solution if a temperature gradient exists therein. This change in concentration is distinct from changes associated with convection processes in the solution. In an electrolyte solution, a simultaneous potential gradient, known as the Soret potential, is obtained. If a condition of dynamic equilibrium with respect to concentration is established, the Soret potential tends to reach a constant limiting value.

Accordingly, it is an object of this invention to provide an improved thermoelectric element having a higher thermoelectric power and a higher figure of merit than those heretofore known or available.

Another object of this invention is to provide improved thermoelectric devices utilizing these elements for the direct conversion of heat into electrical energy.

It is still another object of this invention to provide a process for the direct conversion of heat to electricity by utilization of a Soret effect.

This invention involves the discovery that a steady-state Soret potential may be obtained and maintained in a molten composition of bismuth in bismuth bromide or bismuth chloride, that thermoelectric elements and devices may be made utilizing this potential for the direct conversion of heat to electricity, and that the thermoelectric power and the thermoelectric figure of merit obtained thereby are higher than any heretofore known.

The foregoing and other objects of the invention are accomplished by providing a thermoelectric element which comprises a composition of from about 1 to 30 mole percent bismuth and from about 99 to 70 mole percent bismuth bromide or bismuth chloride or mixtures thereof. This composition is utilized for the thermoelectric generation of power by maintaining it in a molten state, establishing a temperature gradient therein and, by then preventing convective heat flow within this composition, enabling a steady-state concentration and temperature gradient to be maintained therein. The steady-state Soret potential that is established reaches a constant limiting value under conditions of dynamic equilibrium, and thermoelectric power values in excess of 15,000 $\mu$v./° C. may be obtained for selected concentration values of bismuth in bismuth bromide or bismuth chloride.

The thermoelectric energy conversion of the present invention utilizing the Soret effect is essentially accomplished by an oxidation-reduction process in a thermogalvanic cell utilizing inert electrodes. In addition to the very high thermoelectric power that is obtained thereby in the bismuth-bismuth bromide and bismuth-bismuth chloride systems, this mode of thermoelectric energy conversion affords a number of other advantages over the more customary solid state semiconductor systems. Thus, the thermoelectric elements of the present invention desirably can be made to have a lower thermal conductivity by the elimination of convective heat flow therein, are less susceptible to radiation damage, are not degraded in their thermoelectric power because of thermal diffusion as occurs with some semiconductors, and are free of contact resistance problems.

The invention will be described in greater detail with reference to the accompanying drawings, in which.

Figure 1:
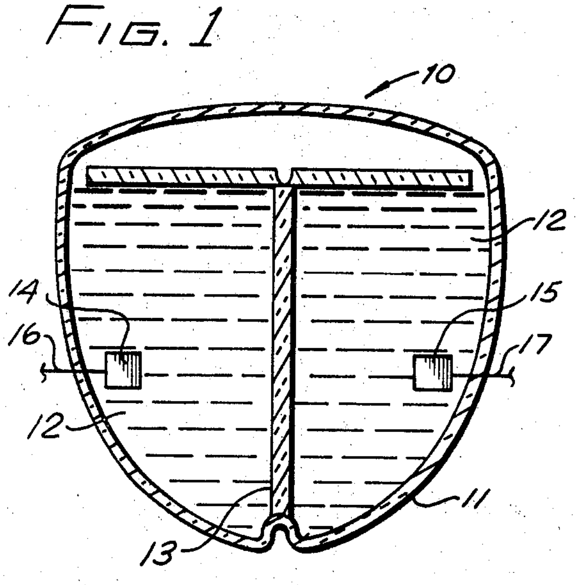
FIG. 1 is a schematic cross-sectional view of one embodiment of a thermoelectric device according to the invention.

Referring to FIG. 1, a thermoelectric device comprising a single thermoelectric element is shown for the direct conversion of thermal energy to electrical energy. The device 10 comprises a container 11 which contains a thermoelectric composition 12 and serves to prevent loss of this composition by volatilization when it is in the molten state.

The material used for the container 11 may be any suitable material capable of withstanding temperatures up to about 600° C. or higher, and of withstanding a pressure of about 3 atmospheres at 500° C., or higher pressures at more elevated temperatures. The feasible cold-junction temperature of operation of the device is above the melting point of the composition of bismuth in bismuth bromide or chloride, which is about 230° C. While the device may be satisfactorily operated at temperatures above 500° C., problems of pressure, containment, and corrosion may limit such operation. Accordingly, it is preferred to operate the device at a temperature between about 230 and 500° C. For the preferred temperature range of operation of the device, between about 230 and 500° C., refractory materials such as Pyrex glass, quartz, and impervious ceramics are suitable.

The thermoelectric composition 12 contained in container 11 consists of a mixture of pure bismuth together with bismuth bromide or bismuth chloride or a mixture of these salts. The bismuth is present in amounts from about 1 to 30 mole percent. Above 30 mole percent, the Soret effect obtained becomes minimal, with a marked reduction in thermoelectric power. Although the thermoelectric power approaches a maximum as the molar concentration of bismuth in the solution is decreased, at molar concentrations below 1%, insufficient bismuth is present to establish Soret steady-state concentration and potential gradients. Concentrations of bismuth between about 1 and 10 mole percent in bismuth bromide are preferred. For the bismuth chloride solution, concentrations of bismuth between about 5 and 10 mole percent are preferred.

An ion-permeable barrier 13 serves to establish two compartments in the device and prevents convective heat flow between the thermoelectric compositions in these compartments. The material used for barrier 13 may be the same as the refractory material used for container 11. In operation of the device, employing a single thermoelectric element, after the composition is brought to a temperature above its melting point, preferably between 230 and 500° C., a temperature gradient of between about 5 and 20 degrees is established between the two compartments, and a Soret effect tending to establish a concentration gradient becomes operative. For a thermoelectric power of 15,000 $\mu$v./° C. and a temperature gradient of 10 degrees, a limiting Soret potential of about 0.15 volt is attained when steady-state conditions are established in the device. The temperature gradient that may be established across a single thermoelectric element is limited to between about 5 and 20 degrees, and increasing the temperature gradient beyond the limiting value would serve only to decrease the value of the thermoelectric power. However, a thermoelectric device containing a plurality of thermoelectric elements may be operable over the entire temperature range above 230° C., and preferably between about 230° C. and 500° C.

While barrier 13 establishes two compartments in the device, its construction permits a common vapor passage so that a uniform pressure is maintained within the device. Although the concentration of bismuth in the molten solution in each compartment of the device is different, the bismuth is in homogeneous solution, the actual concentration gradient occurring within barrier 13 which is permeable to the passage of bismuth ions therethrough, although preventing convective heat flow.

Electrodes 14 and 15, with corresponding wire leads 16 and 17, are used for obtaining a useful flow of current from the device. The utility of this device as a thermoelectric generator is demonstrated by the passage of a current of 1.8 milliamperes through a load of 30 ohms at a voltage of 54 millivolts at 500° C.; also leads 16 and 17 may be short-circuited without the occurrence of any polarization effects, thereby assuring a steady flow of current. Electrodes 14 and 15 are of any suitable conductive material, e.g., refractory metals and alloys, that is inert to the molten bismuth-bismuth bromide or bismuth-bismuth chloride solution. Electrodes of tungsten or its alloys are particularly suitable and preferred.

Figure 2:
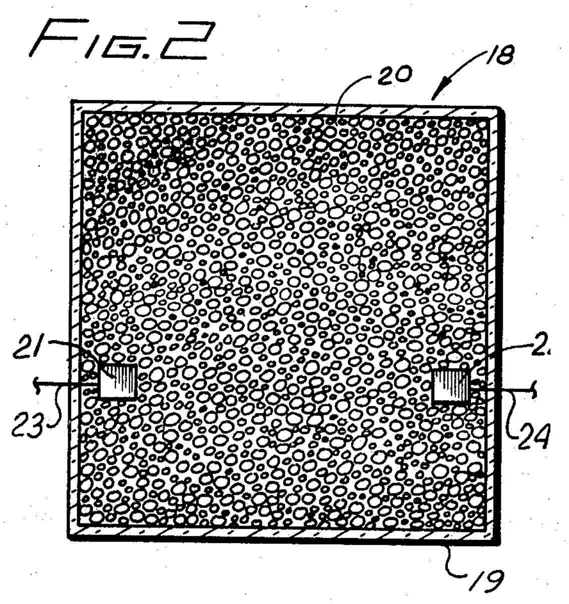
FIG. 2 is a schematic cross-sectional view of another embodiment of a thermoelectric device.

In FIG. 2 is shown another embodiment of a thermoelectric device useful in the practice of this invention. The device 18 consists of a sealed container 19 which suitably may be of Pyrex glass, quartz, or a ceramic material suitable for operation at elevated temperatures. In this device convection effects are prevented within the composition by filling the device with a plurality of close-packed inert refractory particles of glass, quartz, or ceramic in the form of beads, rings, spheres, or the like. In operation of the device, the composition of bismuth and bismuth bromide or bismuth chloride is brought to the molten state, preferably between about 230 and 500° C., and a concentration gradient is established therein by maintaining opposite ends of the device at different temperatures, preferably maintaining between about a 5- and 20-degree temperature gradient. Any convenient source of heat is suitable provided the entire device is maintained at a temperature above 230° C. Because of the presence of the close-packed refractory beads in the device, the obtained concentration gradient is maintained and a steady-state Soret potential is established. Current may be conveniently drawn from the device by means of non-reactive electrodes 21 and 22 and their corresponding lead wires 23 and 24.

For both FIG. 1 and FIG. 2, either end of the device may be maintained as the hot side, this hot side constituting the negative terminal of the cell with respect to the external circuit. Upon reversal of the temperature gradient, the direction of current flow will be reversed.

Figure 3:
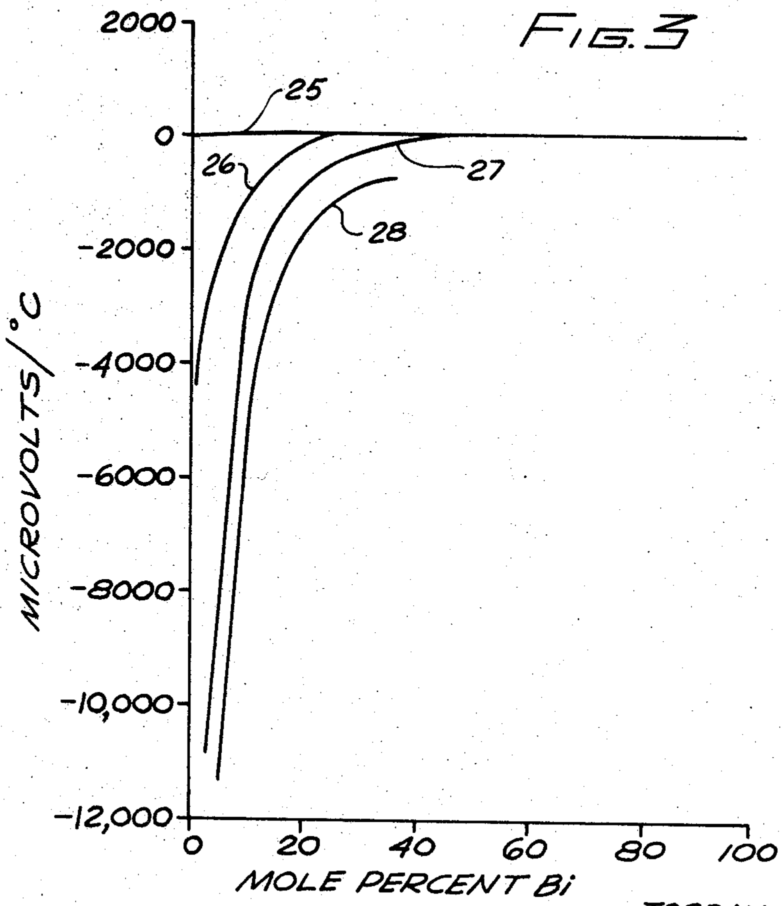
FIG. 3 is a graph showing the variation of thermoelectric power with molar concentration of bismuth in the molten solution.

In FIG. 3 the initial and steady-state thermoelectric power is graphically shown as a function of the molar percentage of bismuth present for the Bi—$BiBr_3$ and the Bi—$BiCl_3$ systems at 500° C. With respect to other bismuth halides, the bismuth fluoride system is not feasible because of the high melting point of this salt (727° C.). The Bi—$BiI_3$ system, while feasible at temperatures above 410° C., gives lower values of thermoelectric power, but has been included in FIG. 3 for comparative purposes. The initial thermoelectric power, which is shown as an average curve 25, is essentially due to a Seebek effect and is of relatively minor importance compared with the much larger steady-state Soret potentials attained once dynamic equilibrium is established. In curve 26 the steady-state thermoelectric power at 500° C. in the Bi—$BiI_3$ system is shown. As may be noted, the maximum thermoelectric power achieved is slightly above 4,000 $\mu$v./° C. In marked and significant contrast, curve 27, which represents a plot of the steady-state thermoelectric power in the Bi—$BiBr_3$ system, and curve 28, which represents a plot of the steady-state thermoelectric power in the Bi—$BiCl_3$ system, show unexpectedly high values of thermoelectric power, in excess of 10,000 $\mu$v./° C., at the lower molar concentrations of bismuth. These thermoelectric powers are the highest heretofore attained by any material. By contrast, solid thermoelectric materials, such as lead telluride and silicon-germanium, show thermoelectric power of but several hundred microvolts per degree.

In a comparison of the three systems it has been observed, as illustrated graphically in FIG. 3, that the steady-state thermoelectric power increases with dilution of the bismuth content of the system. For the bromide, the values range from 3,000 μv./° C. at 10 mole percent Bi to 16,000 μv./° C. at 1 mole percent Bi; for the chloride, 3,100 μv./° C. at 10 mole percent Bi to 11,900 μv./° C. at 5 mole percent Bi; for the iodide, 500 μv./° C. at 10 mole percent Bi to 4,600 μv./° C. at 1 mole percent Bi.

The following examples illustrate the practice of this invention but are not to be construed as limitations thereof.

EXAMPLE 1

Bi—$BiBr_3$ system

A cell similar to the device illustrated in FIG. 1 was used. A Pyrex sintered-glass disk of medium porosity and 10 mm. diameter separated the two compartments, each fitted with a 20-mil tungsten electrode and a thermocouple well. After the tungsten electrodes were sealed in a cell, they were cleaned electrochemically in an aqueous solution of potassium hydroxide. The thermocouple wells contained two chromel-alumel thermocouples connected in opposition, and the resulting net signal was fed to a differential thermocouple temperature controller which maintained the desired temperature difference across the sintered-glass disk with an accuracy of ±0.025° C. The cell was maintained as a closed system because of the vapor pressure of bismuth bromide at 500° C. The compartments were connected for vapor passage to provide pressure equalization. The cell was maintained in a furnace which was adjusted so that one compartment of the cell was slightly cooler than the other.

Commercially obtained bismuth bromide was purified by distillation under vacuum. The bismuth used was 99.99% pure, an oxide-free sample from the interior of solid ingots being used without further purification. After introduction of the powdered bismuth and bismuth bromide into the cell via a long fill tube, the cell was evacuated and sealed at a pressure of $10^{-5}$ torr. Both initial and steady-state thermoelectric powers were determined at temperatures of 300, 400 and 500° C. for bismuth concentrations varying from 1 to 95 mole percent. The results obtained are shown in Table 1.

TABLE 1.—Bi-$BiBr_3$ SYSTEM

| | Initial thermoelectric power, μv./° C. | | | Steady-state thermoelectric power, μv./° C. | | |
|---|---|---|---|---|---|---|
| | 300° C. | 400° C. | 500° C. | 300° C. | 400° C. | 500° C. |
| Mole percent: | | | | | | |
| 1 | | | | −18,000 | −17,000 | −16,000 |
| 3 | | | | −13,000 | −15,000 | −11,000 |
| 5 | | | | −13,000 | −11,000 | −9,000 |
| 15 | −168 | −138 | −106 | −7,000 | −5,050 | −3,000 |
| 20 | | | −140 | | | −750 |
| 25 | | | −16 | | | −410 |
| 30 | | −28 | 10 | −1,460 | −870 | |
| 35 | −75 | 25 | 60 | | −540 | −175 |
| 40 | 45 | 40 | 40 | | | −98 |
| 50 | 14 | 40 | 37 | −113 | −40 | 18 |
| 80 | | 30 | 14 | | 30 | 14 |
| 95 | | 17 | 19 | | 17 | 19 |

As may be noted from Table 1, the highest thermoelectric powers were achieved at the lowest concentration shown, namely, 1 mole percent Bi. Above 30 mole percent Bi, the thermoelectric power due to the Soret effect decreases markedly; therefore, concentrations of bismuth in excess of about 30 mole percent are not of interest in the practice of this invention.

EXAMPLE 2

Bi—$BiCl_3$ system

The procedure and equipment used was substantially the same as that described in Example 1 for the Bi—$BiBr_3$ system. Measurements were made for the Bi—$BiCl_3$ system at temperatures of 300, 400, and 500° C. for bismuth concentrations of 5, 10, 20, and 30 mole percent. The results obtained are shown in Table 2.

TABLE 2.—THE Bi-$BiCl_3$ SYSTEM

| | Initial thermoelectric power, μv./° C. | | | Steady-state thermoelectric power, μv./° C. | | |
|---|---|---|---|---|---|---|
| | 300° C. | 400° C. | 500° C. | 300° C. | 400° C. | 500° C. |
| Mole percent: | | | | | | |
| 5 | | | | | | −11,900 |
| 10 | | −90 | −45 | | −3,700 | −3,100 |
| 20 | | −115 | −80 | | −2,340 | −1,550 |
| 30 | −250 | −85 | −10 | −2,100 | −1,400 | −935 |

It is particularly preferred in the practice of this invention for the Bi—$BiBr_3$ and Bi—$BiCl_3$ systems that a molar concentration of Bi in $BiBr_3$ between 1 and 10 mole percent and of Bi in $BiCl_3$ between 5 and 10 mole percent be present. Within these ranges of concentration, a balance is attained between the attained thermoelectric power, the time required for the system to achieve a steady-state Soret potential, which time may vary from 10 minutes to several hours, lower concentrations of bismuth requiring a greater time to reach a steady-state Soret potential, and the maximum temperature differential that may efficiently be applied. The Bi—$BiBr_3$ system is particularly preferred in this regard.

Applying the formula for the figure of merit Z, previously defined, it is found that the figure of merit for the best value of thermoelectric power obtained, namely, 16,000 μv./° C., at a concentration of 1 mole percent Bi in $BiBr_3$, and using a value for the specific electrical conductivity of 0.4 $(\text{ohm-cm.})^{-1}$ and an average estimated value of 0.008 watt/° C.-cm. for the thermal conductivity, a figure of merit of $12.8\times10^{-3}$/° C. is obtained. This value of Z is the highest heretofore known and is at least ten times greater than values reported for the lead telluride system or calculated for the Bi—$BiI_3$ system. It is noted that in the article "Thermoelectric Effects" by F. E. Jaumot, Pros. IRE, vol. 66, No. 3 (March 1958), at page 53, it is stated that a figure of merit above $4\times10^{-3}$/° C. would make thermoelectric generation practical for many consumer uses, and a figure of merit several times larger would be competitive with commercial power production.

The efficiency of a thermoelectric generator will increase as Z, the figure of merit, increases. However, since thermoelectric generators are heat engines, they are Carnot-cycle limited, and their efficiency will therefore also depend on the difference in temperature between the hot and cold junctions of the couple, larger temperature differences providing greater efficiencies. With the present Bi—$BiBr_3$ and Bi—$BiCl_3$ materials used in a single thermoelectric element, the cold junction temperature may be maintained between about 230 and 500° C., and the hot junction temperature will be maintained about 5 to 20 degrees higher. However, this limitation on the thermodynamic efficiency of a single thermoelectric element may be significantly overcome by providing a thermoelectric device utilizing a plurality of series-connected thermoelectric units to provide multiple stage thermoelectric generation of power, as described by T. C. Harman in "Multiple Stage Thermoelectric Generation of Power" in J. Appl. Phys., vol. 29, p. 1471 (October 1958).

The electrochemical phenomena characterizing a melt of a metal dissolved in its metallic salt are highly complex and but imperfectly understood. However, without being limited thereby, the following is offered by way of theoretical explanation of the present invention. The thermoelectric energy conversion of the present invention utilizing the Soret effect is essentially accomplished by an oxidation-reduction process in a two-component thermogalvanic cell. In thermogalvanic cells where the electrode is an active component of the system, such as the silver-silver nitrate cell using silver electrodes, material is dissolving from one electrode and depositing on the other, often resulting in polarization and dendritic growth on the electrodes, thus necessitating reversal of current direction in the cell during operation. However, in the presently utilized oxidation-reduction thermogalvanic cell, the electrodes are inert and are not consumed during cell operation. Bismuth dissolved in its bromide, chloride and iodide salts is capable of operation as an oxidation-reduction thermogalvanic cell. In the system bismuth-bismuth triiodide, at salt-rich compositions (less than 50 mole percent Bi) in the molten state, bismuth metal is believed to be present as $Bi^{+}$, and a two-electron transfer between $Bi^{+}$ and $Bi^{+3}$ has been postulated to explain the specific conductivity of the system at elevated temperatures. Thus, one may assume that in a thermogalvanic cell containing bismuth-bismuth triiodide, the half-cell electrode reactions are:

Anode reaction: $Bi^{+} \rightarrow Bi^{+3} + 2e$
Cathode reaction: $Bi^{+3} \rightarrow Bi^{+} - 2e$ In cell operation, the $Bi^{+}$ ions will move toward the anode, which is the thermally "hot" electrode, where oxidation will occur, and the $Bi^{+3}$ ions will move toward the cathode, where reduction will occur. The foregoing electrode reactions are independent of whether or not other conditions are present to establish a steady-state Soret potential.

By contrast, for the bismuth bromide and bismuth chloride systems, the bismuth in the salt-rich region dissolves by reaction with the trihalide to form the monomer subhalide, BiBr or BiCl, which then polymerizes to form the tetramer. These polymers are believed to be absent in the iodide case. Accordingly, for the bromide and chloride solutions, the polymer species $Bi_4Br_4$ and $Bi_4Cl_4$ ($Bi_4X_4$) are present, and the half-cell electrode reactions in these cases may be postulated as:

Anode reaction: $Bi_4X_4 \rightarrow 4Bi^{+} + 4X^{-}$; $Bi^{+} \rightarrow Bi^{+3} + 2e^{-}$
Cathode reaction: $Bi^{+3} \rightarrow Bi^{+} - 2e^{-}$; $4Bi^{+} 4X^{-} \rightarrow Bi_4X_4$ It has been observed that there is a large increase in the steady-state thermoelectric power in the chloride and bromide systems compared with the iodide system. Two contributing effects offer a possible explanation of this phenomena and are set forth below.

The negative sign of the steady-state thermoelectric power is directly proportional to the amount of entropy transported across a temperature gradient by a species reversible at the electrodes. Since the sign of the potential is negative, and it is known that the ion of lower valence migrates to the hot electrode (anode), entropy transported to this electrode will increase the negative value of the steady-state thermoelectric power. There are two mechanisms whereby entropy can be transported: (1) by a charged species' effect on its surroundings, called charge ordering; and (2) by the amount of entropy actually inherent with the species.

The extent of a species' effect in ordering its surroundings depends on its charge, thus the sequence $$Bi^{+}{}_{3} > Bi^{+} > Bi_4X_4$$

shows the relative order of this effect. The direction of flow of these species is in an opposite direction to the flow of entropy resulting from the charge ordering. In the iodide system the two opposing ion flows, $Bi^{+3}$, and $Bi^{+}$, would therefore produce a net effect of transporting entropy to the anode. However the net effect of entropy transport in the chloride and bromide systems is greater because the two opposing flows, $Bi^{+3}$ and $Bi_4X_4$, have a greater charge difference. Thus the charge-ordering effect contributes a greater quantity of entropy in the chloride and bromide systems, thus increasing their steady-state thermoelectric power compared with the iodide system.

The second mechanism of entropy transfer operates differently in the three systems also. Since the lower valent ion ($Bi^{+}$ for iodide, $Bi_4X_4$ for bromide and chloride) migrates toward the anode, its entropy will contribute to the steady-state thermoelectric power, diminished by the entropy of the $Bi^{+3}$ flow in the opposite direction. The entropy inherent in the $Bi^{+}$ and $Bi^{+3}$ species is essentially of the same magnitude. The polymer species present in the bromide and chloride systems contain much more entropy than the $Bi^{+3}$ monomer because of the size and complexity of the polymer species. Therefore, more entropy is transported across the thermal gradient in the chloride and bromide systems by this mechanism than in the iodide system. These two effects, charge ordering and inherent species entropy, thus both combine to account for the large steady-state thermoelectric powers in the Bi—$BiBr_3$ and Bi—$BiCl_3$ systems compared with the iodide systems.

It will, of course, be understood that many variations may be made in the practice of this invention without departing from the spirit thereof. Thus, various means other than those specifically illustrated and described in the embodiments shown may be provided for preventing convection flow within the composition when in the molten state so that a temperature gradient and a concentration gradient will be maintained in the thermoelectric element. Also, while for most applications the use of pure bismuth dissolved in bismuth bromide or bismuth chloride or mixtures thereof, is preferred, noninterfering diluents or materials of lower activity, such as bismuth iodide, may be introduced into the system to provide other advantages such as increased liquidus range or increased electrical conductivity. Thus, while in accordance with the provisions of the patent statutes, the principle, preferred construction, and mode of operation of the invention have been explained, and what is now considered to represent its best embodiment has been illustrated and described, it should be understood that within the scope of the appended claims, the invention may be practiced otherwise than as specifically illustrated and described.

I claim:

1. A thermoelectric element comprising a composition consisting essentially of about 1 to 30 mole percent bismuth and about 99 to 70 mole percent of at least one of bismuth bromide and bismuth chloride, means for containing said composition to prevent loss thereof from said thermoelectric element when said composition is in the molten state, means for preventing convective heat flow within said composition when in the molten state and having a temperature gradient therein, and means for permitting passage of vapor of at least one of said bismuth bromide and bismuth chloride from one portion of the composition at one temperature to another portion thereof at a lower temperature.

2. The thermoelectric element of claim 1 wherein said composition in the molten state consists of a solution of between about 1 and 10 mole percent bismuth in bismuth bromide.

3. The thermoelectric element of claim 1 wherein said composition in the molten state consists of a solution of between about 5 and 10 mole percent bismuth in bismuth chloride.

4. A thermoelectric element according to claim 1 wherein said means for preventing convective heat flow comprises refractory material nonreactive wtih said composition at a temperature between about 230 and 500° C. and permeable to the passage of ions of said composition in the molten state.

5. A thermoelectric power generating device which generates power at temperatures between about 230° C. and 500° C. comprising a pair of inert electrodes each in contact with a different portion of a composition consisting essentially of about 1 to 30 mole percent bismuth and about 99 to 70 mole percent of at least one of bismuth bromide and bismuth chloride, means for preventing convective heat flow between said portions when in the molten state and having a temperature difference therebetween while permitting a flow of ions between said electrodes, means for permitting passage of vapor of at least one of said bismuth bromide and bismuth chloride from one portion at one temperature to another portion at a lower temperature, and external leads connected to said electrodes for the flow of current.

6. A device according to claim 5 wherein said inert electrodes are selected from the class consisting of tungsten and alloys thereof.

7. A device according to claim 5 wherein said composition in the molten state consists of a solution of between about 1 to 10 mole percent bismuth in bismuth bromide.

8. A device according to claim 5 wherein said composition in the molten state consists of a solution of between about 5 and 10 mole percent bismuth in bismuth chloride.

9. The process for the production of thermoelectric power which comprises providing a molten composition at a temperature between about 230 and 500° C. consisting of a solution of about 1 to 30 mole percent bismuth in at least one of bismuth bromide and bismuth chloride, maintaining a first portion of said composition at a higher temperature than a second portion to establish a temperature gradient in said composition and a resultant concentration gradient, preventing convective heat flow within said molten composition sufficient to retain said temperature gradient and concentration gradient therein, and permitting passage of vapor of at least one of said bismuth bromide and bismuth chloride from said first portion to said second portion sufficient to maintain said concentration gradient.

10. The process of claim 9 wherein said composition in the molten state consists of a solution of between about 1 and 10 mole percent bismuth in bismuth bromide.

11. The process of claim 9 wherein said composition in the molten state consists of between about 5 and 10 mole percent bismuth in bismuth chloride.

References Cited

UNITED STATES PATENTS 3,253,955 5/1966 Clampitt et al. ______ 136—83.1

OTHER REFERENCES

ASTIA-A.D. 30304, Sept. 18, 1962, p. 6, Thermal Batteries.

ASTIA-A.D. 56215, Sept. 19, 1962, Thermal Batteries, p. 1.

ASTIA-A.D. 60427, Sept. 19, 1962, pp. 5 and 16.

ASTIA-A.D. 286686, June 1962, Hunger et al. p. 51.

ALLEN B. CURTIS, Primary Examiner